(12) United States Patent
Chilappagari et al.

(10) Patent No.: US 10,411,735 B1
(45) Date of Patent: Sep. 10, 2019

(54) SYSTEMS AND METHODS FOR AN ITERATIVE DECODING SCHEME

(71) Applicant: Marvell International Ltd., Hamilton (BM)

(72) Inventors: Shashi Kiran Chilappagari, San Jose, CA (US); Dung Viet Nguyen, San Jose, CA (US); Phong Sy Nguyen, Ho Chi Minh (VN)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/693,709

(22) Filed: Sep. 1, 2017

Related U.S. Application Data

(63) Continuation of application No. 14/855,829, filed on Sep. 16, 2015, now Pat. No. 9,755,665.

(60) Provisional application No. 62/054,088, filed on Sep. 23, 2014.

(51) Int. Cl.
*H03M 13/11* (2006.01)
*H03M 13/00* (2006.01)
*H03M 13/37* (2006.01)

(52) U.S. Cl.
CPC ... *H03M 13/1105* (2013.01); *H03M 13/3746* (2013.01); *H03M 13/1111* (2013.01); *H03M 13/1128* (2013.01)

(58) Field of Classification Search
None
See application file for complete search history.

(56) References Cited

U.S. PATENT DOCUMENTS

| | | | | |
|---|---|---|---|---|
| 9,214,959 B2 * | 12/2015 | Yang | ................ | H03M 13/1122 |
| 9,258,015 B2 * | 2/2016 | Ish-Shalom | ........ | H03M 13/1111 |
| 9,294,129 B2 * | 3/2016 | Zhu | ................... | H03M 13/1111 |
| 9,344,116 B2 * | 5/2016 | Lin | .................... | H03M 13/1111 |
| 2008/0148128 A1 * | 6/2008 | Sharon | ............... | H03M 13/1131 |
| | | | | 714/758 |
| 2015/0180511 A1 * | 6/2015 | Ish-Shalom | ........ | H03M 13/1111 |
| | | | | 714/776 |

* cited by examiner

*Primary Examiner* — Justin R Knapp (57) ABSTRACT

System and methods described herein includes a method for iterative decoding. The method includes instantiating an iterative decoding procedure to decode a codeword. At each iteration of the iterative decoding procedure, the method further includes retrieving information relating to a plurality of current decoding variables at a current iteration, determining a first current decoding variable to be skipped for the current iteration based on the information, and processing a second decoding variable without processing the first decoding variable to update related decoding variables from the plurality of current decoding variables.

22 Claims, 7 Drawing Sheets

SYSTEMS AND METHODS FOR AN ITERATIVE DECODING SCHEME

CROSS-REFERENCE TO RELATED APPLICATION

This disclosure is a continuation of and claims the benefit of commonly-owned and co-pending U.S. Nonprovisional patent application Ser. No. 14/855,829, filed Sep. 16, 2015, which in turn claims the benefit of U.S. Provisional Patent Application No. 62/054,088 filed Sep. 23, 2014. The aforementioned applications are hereby incorporated by reference herein in their entirety.

FIELD OF USE

This disclosure relates to an iterative decoding scheme for a low-density parity-check (LDPC) code.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

Low-density parity-check (LDPC) codes can be used to encode data packets in storage and communication systems. At a receiver, when a signal is received, the received signal can be decoded via an iterative decoding process. Several performance metrics are considered in designing an iterative decoder, such as the throughput of the decoder, the reliability performance (signal-to-noise ratio gain), and the power efficiency of the decoder.

SUMMARY

System and methods described herein includes a method for iterative decoding. The method includes instantiating an iterative decoding procedure to decode a codeword. At each iteration of the iterative decoding procedure, the method further includes retrieving information relating to a plurality of current decoding variables at a current iteration, determining a first current decoding variable to be skipped for the current iteration based on the information, and processing a second decoding variable without processing the first decoding variable to update related decoding variables from the plurality of current decoding variables.

In some implementations, the plurality of current decoding variables includes block columns of a parity-check matrix.

In some implementations, the information includes a skip counter status associated with each of the plurality of current decoding variables, and the skip counter status indicates a number of subsequent iterations for a respective current decoding variable to be skipped.

In some implementations, the method further includes searching the information for a skip counter status that indicates a respective current decoding variable is to be processed at the current iteration. The searching is pipelined with the processing the second decoding variable.

In some implementations, the plurality of current decoding variables includes a first group and a second group, and decoding variables in the second group are processed before decoding variables in the first group at the current iteration.

In some implementations, the information includes a group number associated with each decoding variable of the plurality of the current decoding variable, and the group number indicates whether a respective decoding variable is to be processed or an order when the respective decoding variable is to be processed at the current iteration.

In some implementations, the group number further indicates a number of subsequent iterations to skip for the respective decoding variable.

In some implementations, the group number is updated at the end of the current iteration after the related decoding variables are updated.

In some implementations, the plurality of current decoding variables are stored in a memory unit. The method further includes storing, at a flag memory unit, a flag vector associated with the plurality of current decoding variables to at least partially indicate a decoding status of the plurality of current decoding variables.

In some implementations, the method further includes determining the first current decoding variable is to be skipped for the current iteration based on reading the flag vector from the flag memory unit, and continuing the decoding procedure without reading the first current decoding variable from the memory unit.

System and methods described herein provides a system for iterative decoding. The system includes an iterative decoder to instantiate an iterative decoding procedure to decode a codeword. At each iteration of the iterative decoding procedure, the decoder retrieves information relating to a plurality of current decoding variables at a current iteration, determines a first current decoding variable to be skipped for the current iteration based on the information, and processes a second decoding variable without processing the first decoding variable to update related decoding variables from the plurality of current decoding variables.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

This disclosure describes methods and systems for an iterative decoding scheme for decoding a parity-check code.

According to this disclosure, a decoding scheme in which one or more variable nodes can be skipped at certain iterations based on a metric computed during the decoding in previous iterations is provided. In another implementation, at each iteration, the variable nodes (or groups of variable nodes) can be processed in an order different from the natural order (e.g., from left to right as originally presented in the parity-check matrix of the linear code) based on a metric computed during the decoding process. In another implementation, syndrome memory operations for a variable node (or a group of variable nodes) can be reduced by skipping a memory read/write operation during one or more iteration. This can be accomplished by establishing a syndrome flag memory to store computed syndromes that are likely to be visited and updated frequently during the decoding process.

Figure 1:
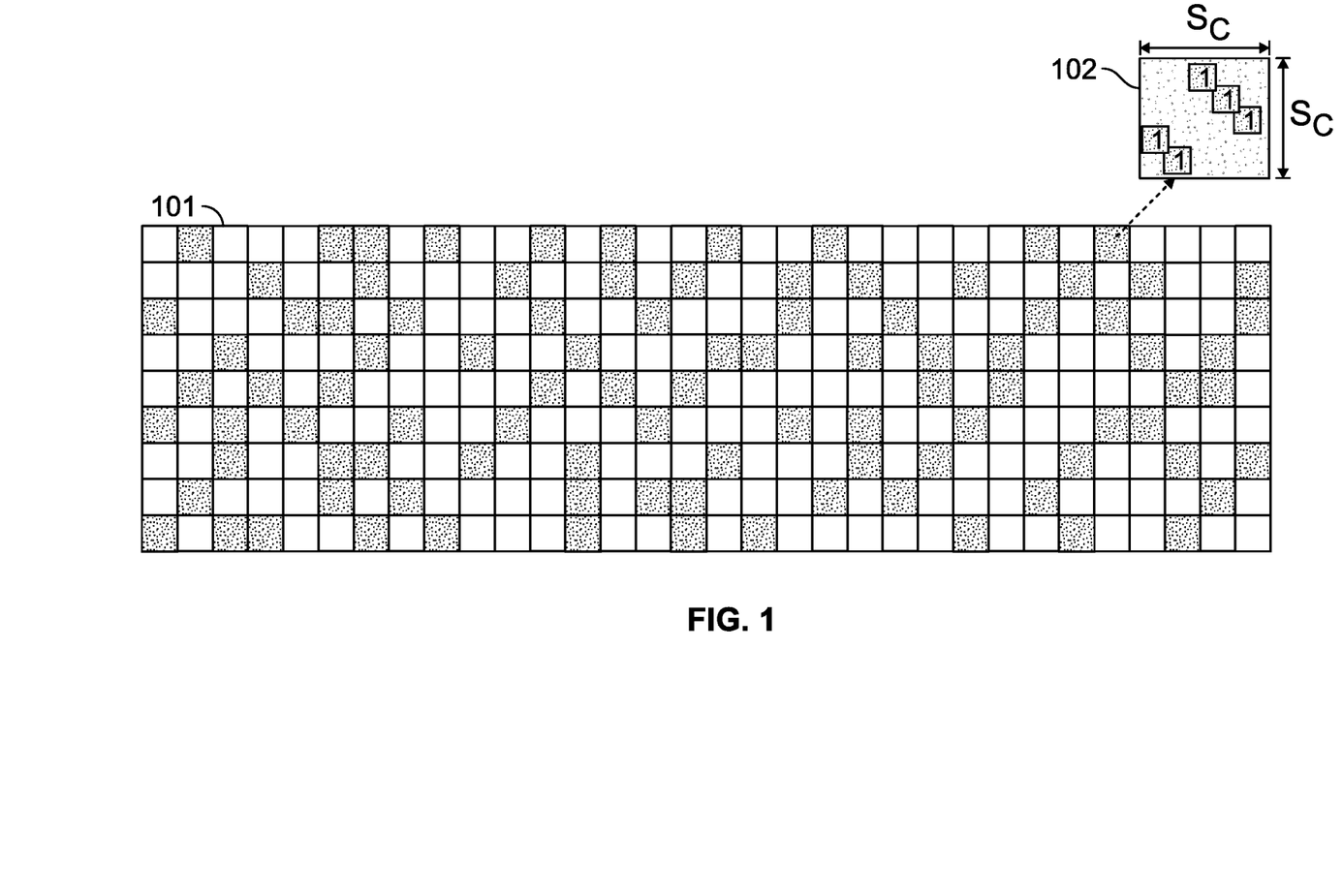
FIG. 1 shows an exemplary block diagram illustrating an LDPC parity check matrix.

FIG. 1 shows an exemplary block diagram illustrating the parity check matrix H of an LDPC code An LDPC H matrix 101 can be structured as a block circulant matrix, because the circulant structure helps to simplify hardware implementation. A block matrix having such a circulant structure can be referred to as a circulant. Active circulants are the ones that contain non-zero entries, e.g., see block 102.

Figure 2:
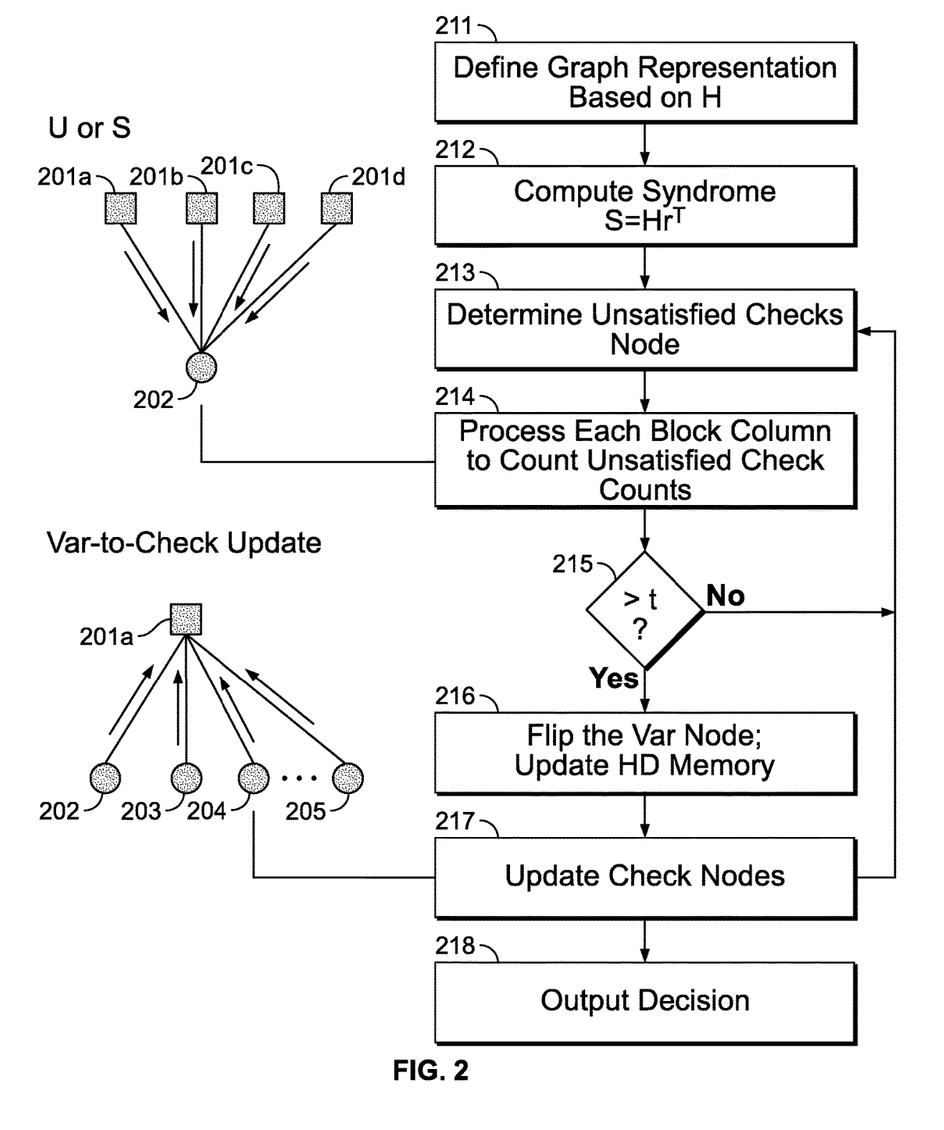
FIG. 2 shows an exemplary logic flow diagram and node structure diagrams illustrating bit-flipping (BF) decoding of an LDPC code.

FIG. 2 shows an exemplary logic flow diagram and node structure diagrams illustrating bit-flipping (BF) decoding of an LDPC code. The LDPC H matrix 101, can be represented by a graph of nodes at 211, with a check node (e.g., 201a-d) representing a row of H, and a variable node (e.g., 202) representing a column of H. The connection between the check node i and a variable node j represent an entry of the matrix $H_{ij}=1$. Thus, a block column or a block row may include one or more variable nodes or check nodes, respectively.

A BF decoder can be employed to decode LDPC codes. For example, at the decoder, a parity-check sum $S_c$ (e.g., a syndrome) can be computed at 212 by taking the vector product of the parity-check matrix H and the received codeword r updated at the current iteration: $S_c=Hr^T$. The computed syndrome can then be processed to determine a number of unsatisfied/satisfied checks, e.g., a check node is unsatisfied when the parity-check equation does not equal to zero. At every iteration in a BF decoder, one block column (or a variable node 202) of the LDPC can be processed at 214 for/with the following operations. The state of check node circulants 201a-d connected to each block column (or the variable node 202) are read by the decoding processor. The number of unsatisfied checks connected to each variable node 202 in the block column is found by summing all check node circulants 201a-d. The number of unsatisfied checks is compared to a threshold at 215 to decide if the variable node 202 needs to be flipped, e.g., by changing from 0 to 1, or vice versa. The threshold t can vary from iteration to iteration. If the variable node 202 is flipped, the current hard decision (HD) memory and the check node circulants 201a-d are updated at 216-217.

For example, as shown at 217, for the check node 201a, the decoder may process all the neighboring variable nodes 202-205, and perform an XOR operation on the incoming bit-messages from the variable nodes 202-205, e.g., indicating whether a variable node has been flipped, and whether the satisfied or unsatisfied status of the check node 201a needs to be changed. The decoding iterations can be repeated until a decoding decision is output at 218, e.g., when the decoding process converges as all the check nodes are satisfied, or alternatively when the iteration limit has been reached and the decoding process is terminated.

In the iterative process, a 1-bit storage may be required for each of the check nodes 201a-d, to store the check status, e.g., satisfied or unsatisfied. Similarly, storage may be used for each of the variable node 202 to store the flip status, e.g., flipped or unflipped. For example, the BF decoders may contain two bits of memory for very variable node, e.g., one bit to store original hard decision and another to store current hard decision. The BF decoder can then determine if the variable node is flipped or not based on the two bits of memory. In some implementations, the variable node 202 may need more than 1-bit storage to store the total number of unsatisfied check neighbors, iteration numbers, and/or the like.

Because of the circulant structure of the LDPC parity check matrix 101, the decoding process can be parallelized, e.g., process a number $S_c$ variable or check nodes in a single clock cycle, referred to herein as a block column or block row, respectively. A same group of processors can be used for decoding by scheduling and memory addressing to handle different portions of the parity check matrix in different clock cycles.

Figure 3:
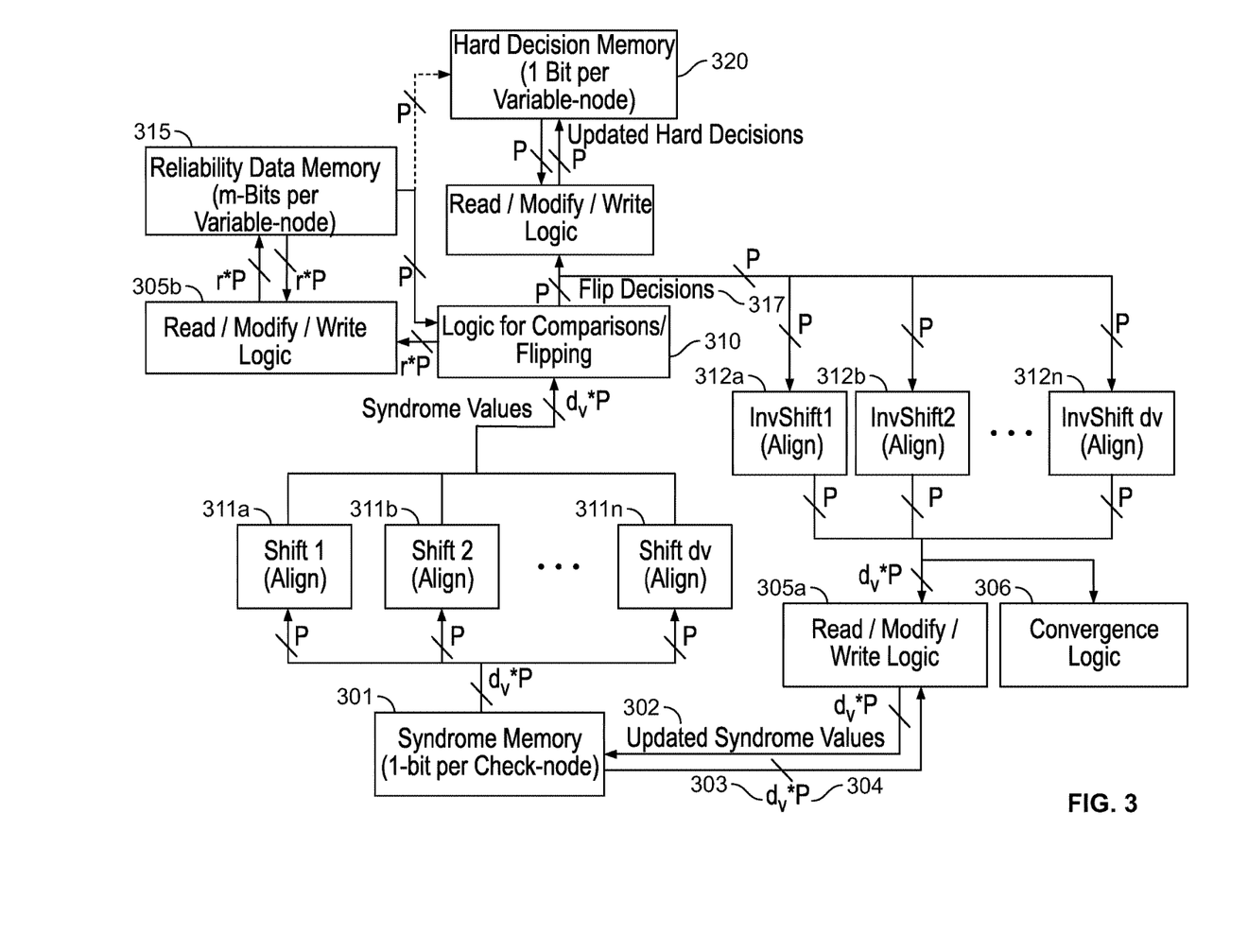
FIG. 3 shows an exemplary block diagram illustrating an iterative BF decoder architecture.

FIG. 3 shows an exemplary block diagram illustrating an iterative BF decoder architecture. A syndrome memory 301 (e.g., one bit per check node) can be employed to store computed syndromes (e.g., at 212 in FIG. 2). Updated syndrome values 302 could be sent to the syndrome memory 301 from a read-write logic 305a, which is connected to a convergence logic 306 that determines whether the decoding process converges. In the example shown in FIG. 3, one block column (group of variable nodes) with degree $d_v$ (303) in one clock cycle is processed in a number P parallel processes (e.g., $P=S_c$). Similarly, the decoder can access multiple block columns (groups of variable nodes) at a time.

A number $d_v$ of shift registers 311a-n may send syndrome values from the syndrome memory 301 to a logic for comparisons or flipping 310, which may write data to a reliability data memory 315 via the read/write logic 305b (e.g., r denotes the number of bits of reliability data per variable node, r=1 or 2). Flipping decisions 317 from the logic 310 can be sent back to the syndrome memory 301 via a number $d_v$ of inverse shift registers 312a-n, to update the syndromes. The flipping decisions 317 can also be sent to update hard decisions in the hard decision memory 320.

In the BF decoder structure shown at FIGS. 2-3, in some scenarios, only a few block columns may contain a variable node that has a sufficient number of unsatisfied checks resulting in a flip. However, all block columns are processed at each iteration to find out that most of them do not contain any node that requires flipping. This may incur unnecessary processing time and thus reduce the efficiency of the decoder.

Figure 4:
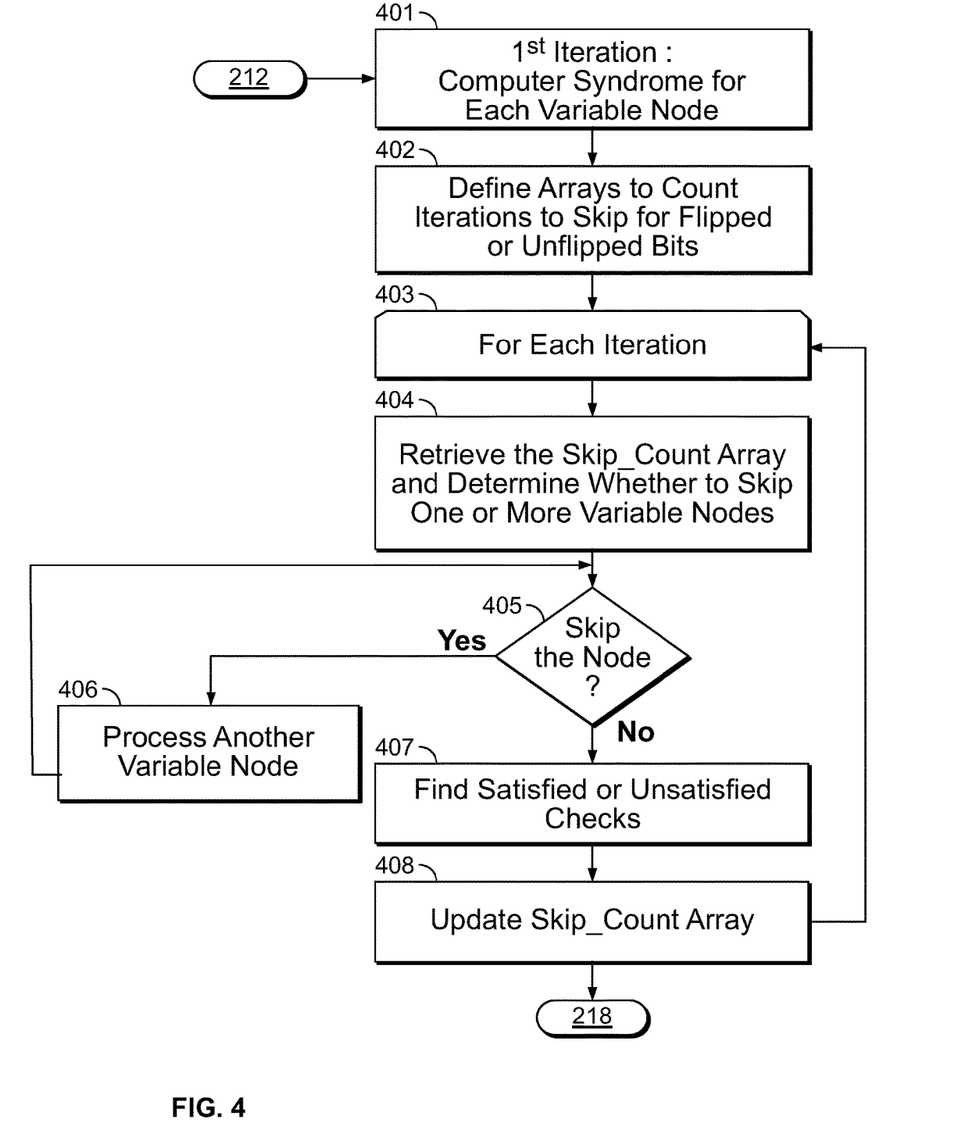
FIG. 4 shows an exemplary logic flow diagram illustrating a BF decoding scheme by skipping one or more variable nodes at an iteration.

FIG. 4 shows an exemplary logic flow diagram illustrating a BF decoding scheme by skipping one or more variable nodes at an iteration. During the BF decoding, most of the variable nodes in error may have a large number of unsatisfied checks during the first iteration or even a first few iteration(s) before a decision can be made. For example, a variable node (that has not been flipped before) may be flipped in the third iteration if it has five or more unsatisfied checks during the third iteration. If a variable node has six satisfied checks in the second iteration, it is unlikely that it will have five or more unsatisfied checks in the third iteration. Thus, this variable node may be skipped for the third iteration to save decoding time.

For example, starting from 212 in FIG. 2, the decoder may start counting iterations from one. In the first iteration, the syndrome is computed for each variable node at 401, without skipping any block columns. At 402, two arrays can be defined to count iterations to skip block columns whether they are flipped or unflipped, e.g., skip_count_unflipped [iter_num][num_sat_checks] and skip_count_flipped [iter_num][num_sat_checks] that specify for each iteration iter_num and each number of satisfied checks num_sat_checks, the number of iterations to skip (the counts can be different for flipped and unflipped bits). For example, skip_count_unflipped[3][6]=2 means that if an unflipped variable node has six satisfied checks in the third iteration, then this variable node can be skipped from processing in next two iterations (the fourth and the fifth). The second iteration, however, may be fully performed, as the number of satisfied checks at the beginning of $2^{nd}$ iteration is unknown. Therefore, processing time can be reduced starting at sub-sequent iterations.

In some embodiments, where some more bits are used to store the reliability of a variable node, more skip-count arrays can be maintained. For example, additional bits for skip_count_unflipped_strong, skip_count_unflipped_weak, skip_count_flipped_strong, skip_count_flipped_weak can be maintained to determine whether the variable node is weak or strong.

Upon defining the skip-count arrays and/or additional parameters, for each iteration at 403, the decoder may retrieve the skip-count arrays and determine whether to skip one or more particular variable nodes at 404. At 405, if a variable node is to be skipped at an iteration, the decoder may move on to process another variable node at 406, and determine whether the other variable node is to be skipped at 405. If the variable node is not to be skipped, the decoder may find the satisfied or unsatisfied neighboring checks at 407, e.g., by performing 213-217 in FIG. 2 to determine whether the variable node needs to be flipped. The skip-count array may then be updated at 408, e.g., based on the increased iteration number, the updated unsatisfied checks, and whether the variable node has been flipped. The above process can be repeated in an iterative manner until a decision is output at 218.

In one implementation, the skipping may not be done on the granularity of single variable node. Instead, an entire block column may be skipped. In this way, skipping can be determined based on the minimum number of satisfied checks in a block column. As an example, skipping can be determined based on a pair (minimum number of satisfied checks for flipped variable nodes, minimum number of satisfied checks for unflipped variable nodes) in block columns that contain a flip. In cases where additional bits are used to store the reliability of the variable nodes, a vector of more than two such minimum numbers can be maintained to store the states of the variable nodes.

For example, a counter may be needed to indicate the number of iterations to skip for each block column. For example, if a maximum of 450 block columns are used in the LDPC codes, an array of size 450 may be needed to keep a is SkipCounter counter, assuming the following parameters: a maximum of three iterations can be skipped; and each entry must be two bits. Thus, a block column is processed only if the counter is equal to 0. If the block column is not processed during an iteration, the counter must be decremented by 1. If a block is processed during a cycle, the counter is updated at the end of the cycle, e.g., in a similar way as updating the skip-counter array for each variable node at 408.

In one implementation, flipped variable nodes and unflipped variable nodes can have different thresholds. Thus, skipping can be performed differently for block columns that contain a flip from block columns without any flip. For example, the threshold to flip back can be generally low. If a block column has a flipped variable node (indicated by a flip_flag indicator), it is likely that it needs to be processed in the subsequent iterations. Thus, most of the entries in the array skip_count_flipped are equal to 0.

In one implementation, the skip-count arrays defined at 402 can be dynamically updated based on performance feedback of the decoder to improve reliability and convergence speed.

Figure 5:
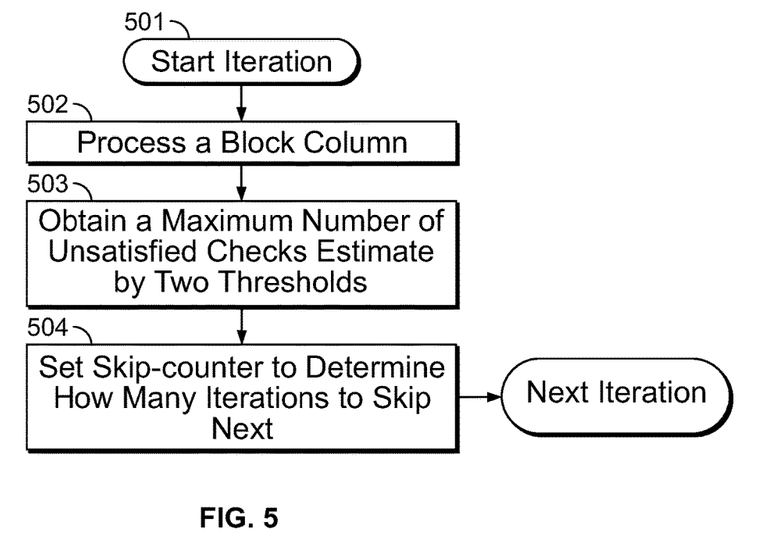
FIG. 5 provides an exemplary logic flow diagram illustrating block column processing.

FIG. 5 provides an exemplary logic flow diagram illustrating block column processing. At each iteration 501, the decoder may start with retrieving a block column. If the block column is processed at 502, the number of unsatisfied checks for each variable node in the block column will be computed. A vector U with a length k equivalent to the circulant size can be used to determine the maximum number of unsatisfied checks in the block column at 503. For each iteration, two thresholds can be specified SkipThr1 and SkipThr2, such that SkipThr1≤SkipThr2.

Each entry in U is compared with SkipThr1 and SkipThr2 to produce two vectors V1 and V2 of length k. Each entry in the vectors V1 and V2 indicates whether the number of unsatisfied checks is less than the respective threshold. For example, V1($i$)=1 when U(i)<SkipThr1; and V2($i$)=1 when U(i)<SkipThr2.

A quantity NumUnsatIndicator can then be defined and computed as follows: NumUnsatIndicator=AND(V1)+AND(V2) where AND(V1) is 1 if all entries of V1 are 1s and AND(V2) is 1 if all entries of V2 are 1s. Specifically, NumUnsatIndicator=0 implies that AND(V1)=0 and AND(V2)=0, which in turn indicates that at least one variable node in the block column has at least SkipThr2 unsatisfied checks. In other words, a maximum number of unsatisfied checks≥SkipThr2. NumUnsatIndicator=1 implies that AND(V1)=0 and AND(V2)=1, which in turn indicates that at least one variable node in the block column has more than SkipThr1 unsatisfied checks but all variable nodes in the block column have less than SkipThr2 unsatisfied checks. In other words, SkipThr1<=Maximum Unsat Checks<SkipThr2. Moreover, NumUnsatIndicator=2 implies that AND(V1)=1 and AND(V2)=1, which in turn indicates that all variable nodes in the block column have less than SkipThr1 unsatisfied checks. In other words, the maximum number of unsatisfied checks<SkipThr1.

For example, if the decoder sets SkipThr1=1 and SkipThr2=3, AND(V1)=1 implies that for each i, U(i)<1, i.e., the number of unsatisfied checks for each variable node is less than 1. It also follows that AND(V2)=1, because if for every variable node the number of unsatisfied checks is less than 1, then it must also be less than 3. Thus, in this case, a maximum number of unsatisfied checks<SkipThr1. If is AND(V1)=0, it implies that there is at least one i, for which U(i)≥1, i.e., there exists a variable node for which the number of unsatisfied checks is greater than or equal to 1. If AND(V2)=1, it implies that for every variable node in the block column, the number of unsatisfied checks is less than 3. Thus, in this case, SkipThr1≤the maximum number of unsatisfied checks<SkipThr2.

The quantity NumUnsatIndicator can then be used to set a skip counter to determine whether to skip, and how many iterations the respective block column may be skipped for the subsequent iterations at 504. For example, two counts can be set, e.g., SkipCount1 and SkipCount2. If NumUnsatIndicator=1 for a block column set, then SkipCounter[j]=SkipCount1. If NumUnsatIndicator=2 for a block column set, then SkipCounter[j]=SkipCount2. If NumUnsatIndicator=0 for a block column, the decoder may set SkipCounter

[j]=0. The values of SkipThr1, SkipThr2, SkipCount1, SkipCount2 can be specified in a scheduler file, e.g., in the switch format like other thresholds.

Figure 6:
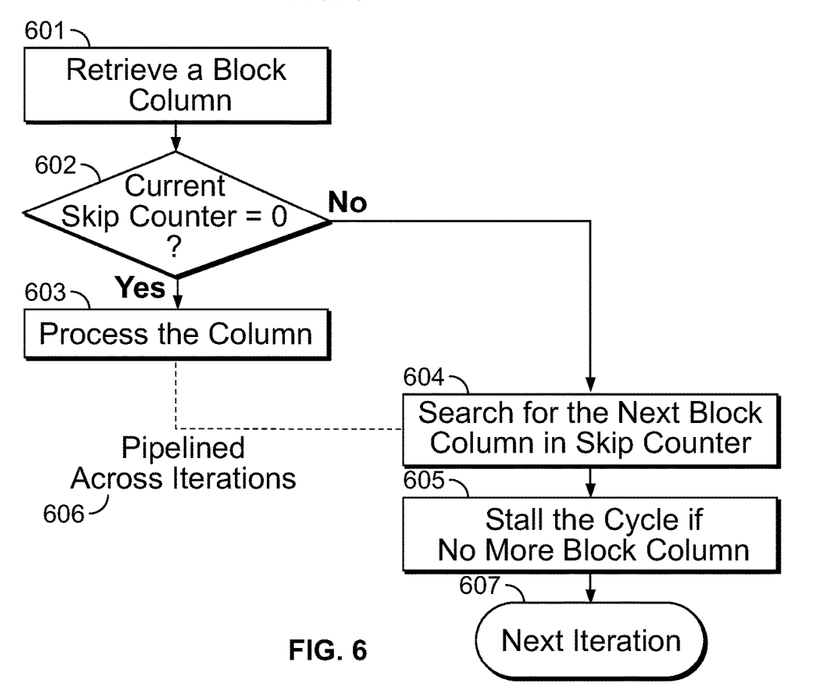
FIG. 6 provides an exemplary logic flow diagram illustrating processing or skipping a block column based on the skip counter during an iteration.

FIG. 6 provides an exemplary logic flow diagram illustrating processing or skipping a block column based on the skip counter during an iteration. Upon setting the skip counter, only block columns that have SkipCounter[ ]=0 at 602 need to be processed at 603. Otherwise, the decoder may search for the next block column that has a SkipCounter entry to be 0 at 604. At a given decoding cycle, the array SkipCounter may be searched for the first location with the entry 0 and retrieve the block column at 601, and all preceding entries must be decremented by 1. When the SkipCounter entry is 0, this operation can be pipelined at 606. For example, at the beginning of the third iteration, one cycle can be spent to figure out the first block column to be processed. In subsequent decoding cycles, while one block column is being processed, the next block column to be processed can be searched. The search for the first location with entry 0 can be limited to a certain depth, e.g., if no location is found, the cycle can be stalled at 605 and the decoder can move on to the next cycle/iteration at 607. Also, a short array of next block columns to be processed can be maintained to reduce the total number of stalled cycles.

For example, the process illustrated at FIG. 5 can be shown in the following example, in which the SkipCounter can be:
[1 0 2 0 0 2 3 1 1 1 0 2]
[1 2 3 4 5 6 7 8 9 10 11 12]

The search depth can be set to be 3 and the length of the array that stores the next block column to process is set to be 4. At the first decoding cycle, the SkipCounter is updated to be:
[0 -1 1 0 0 2 3 1 1 1 0 2]
[1 2 3 4 5 6 7 8 9 10 11 12]

Initially, the CurrentColumnToProcess can be set to be X (e.g., a state that can be an arbitrary value, which does not affect the ultimate result), and then NextColumnToProcess=[2 X X X], and NewPointer=4. The variable NewPointer tracks the position of the logic that searches for the next block column to process, e.g., the current block column that is being searched. Thus, at the second decoding cycle, the SkipCounter is updated to be:
[0 N 1 -1 -1 1 3 1 1 1 0 2]
[1 2 3 4 5 6 7 8 9 10 11 12]

Now the CurrentColumnToProcess can be set to be 2, and then NextColumnToProcess=[4 5 X X], and NewPointer=7. Thus, at the third decoding cycle, the SkipCounter is updated to be:
[0 N 1 N -1 1 2 0 0 1 0 2]
[1 2 3 4 5 6 7 8 9 10 11 12]

Now the CurrentColumnToProcess can be set to be 4, and then NextColumnToProcess=[5 X X X], and NewPointer=10. Thus, at the fourth decoding cycle, the SkipCounter is updated to be:
[0 N 1 N N 1 2 0 0 0 -1 1]
[1 2 3 4 5 6 7 8 9 10 11 12]

Now the CurrentColumnToProcess can be set to be 5, and then NextColumnToProcess=[11 X X X], and NewPointer=13.

Figure 7:
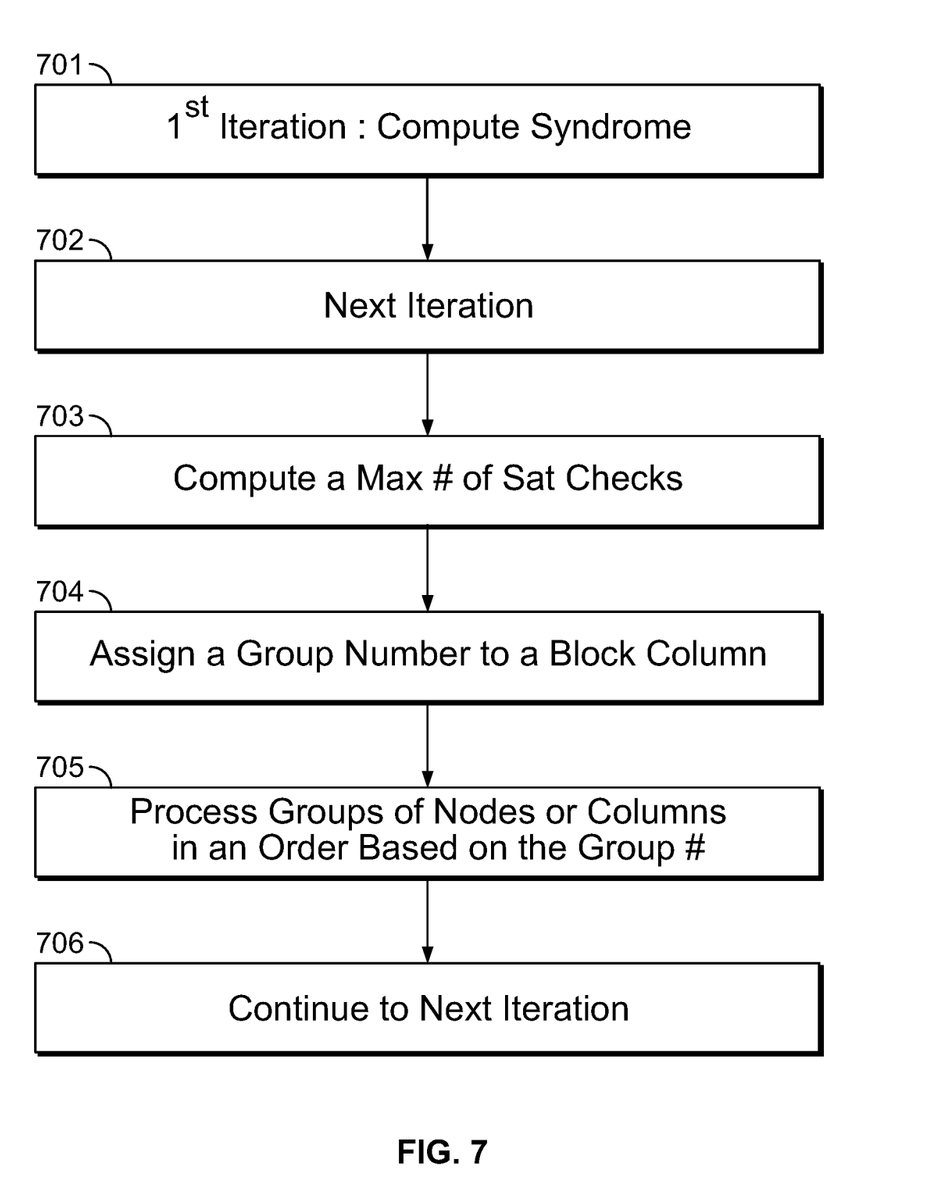
FIG. 7 provides an exemplary logic flow diagram illustrating reordering block columns for processing.

FIG. 7 provides an exemplary logic flow diagram illustrating reordering block columns for processing. At each iteration of BF decoding, variable nodes can be processed in the order they appear from left to right, e.g., the columns from left to right in the LDPC parity-check matrix 101 in FIG. 1. Alternatively, variable nodes that are more likely to be in errors may be processed first. For example, assuming a block code has k-bit errors, if, during each iteration, the first 2k processed variable nodes contain these k corrupted variable nodes then a substantial SNR gain can be realized. As shown in FIG. 7, the decoder can divide the variable nodes into groups with different confidence levels of code accuracy, such that groups with less confidence can be processed first during each iteration.

In the first iteration, the syndrome is computed at 701 (e.g., similar to 212 in FIG. 2). In the subsequent iterations at 702, while processing a variable node (or a block column), the maximum number (or minimum number, depending on the computation complexity) of unsatisfied checks is computed ay 703. Or alternatively, a pair (maximum number of satisfied checks for flipped variable nodes, maximum number of satisfied checks for unflipped variable nodes) in block columns that contains a flip can be computed. In cases when additional bits can be used to store the reliability of the variable nodes, a vector of more than two such maximum numbers can be used to maintain states of the variable nodes, e.g., to indicate a confidence level good or weak of the variable nodes.

Based on the maximum number of satisfied checks, a group number is assigned to the block column at 704. For example, the decoder can define an array GroupMap Unflipped=[0 0 1 1 1 2 2] and GroupMap_Flipped=[0 0 0 0 0 0 1]. This means that in some iteration, if a variable node (or block column) that has not been flipped from its original value has six satisfied checks, the node (or column) will be assigned group number 2. In the next iteration, the decoder can process groups of nodes or columns in an order based on the respective group number at 705. For example, all variable nodes in Group 0 are processed before the variable nodes in Group 1 and so on. The decoder may continue the decoding process to the next iteration with reordered processing based on the group number at 706.

The reordering of block columns illustrated in FIG. 7 can be combined with skipping block columns illustrated in FIG. 406. For example, a special group number can be assigned to all variable nodes to be skipped in next iteration. The decoder can further assign different group numbers to variable nodes to be skipped for different numbers of iterations. For example, group 4 may denote variable nodes to be skipped for one iteration; group 5 may denote variable nodes to be skipped for two iterations and so on.

As shown in FIG. 3, a syndrome memory 301 is used to read from or write to the calculated syndrome values. In the early stage of a device, the raw bit error rate (BER) is generally low, leading to a relatively small number of errors in the codeword. As reading the syndrome memory may be power-consuming, the decoder can be configured to reduce syndrome memory reading at high SNRs. For example, as shown in the following table, when the SNR is high, the average number of errors in the received codewords may decrease, and the average number of syndrome access is reduced.

TABLE 1

| Frequency of Syndrome Access | | |
|---|---|---|
| SNR | Avg. # Errors | Avg. # Syndrome Access |
| 15.8 | 19.5 | 1156 |
| 16.2 | 12 | 996 |
| 16.6 | 7 | 852 |
| 17 | 4 | 740 |

Assume that in the second iteration, a variable node is flipped if it is connected to six unsatisfied checks, and a syndrome flag vector that indicates whether all checks in a row block are satisfied has a length of 50 (e.g., a maximum of 50 rows of parity can be supported). When SNR is high, it is quite possible that a significant number of entries from the syndrome flag vector are 0s, e.g., the respective check nodes are satisfied. Also, as the second iteration proceeds, some corrupted bits are flipped, which can lead more entries of the syndrome flag vector to become 0. Thus, some variable nodes (or block columns) may not need to be read or updated from the syndrome memory 301.

Figure 8:
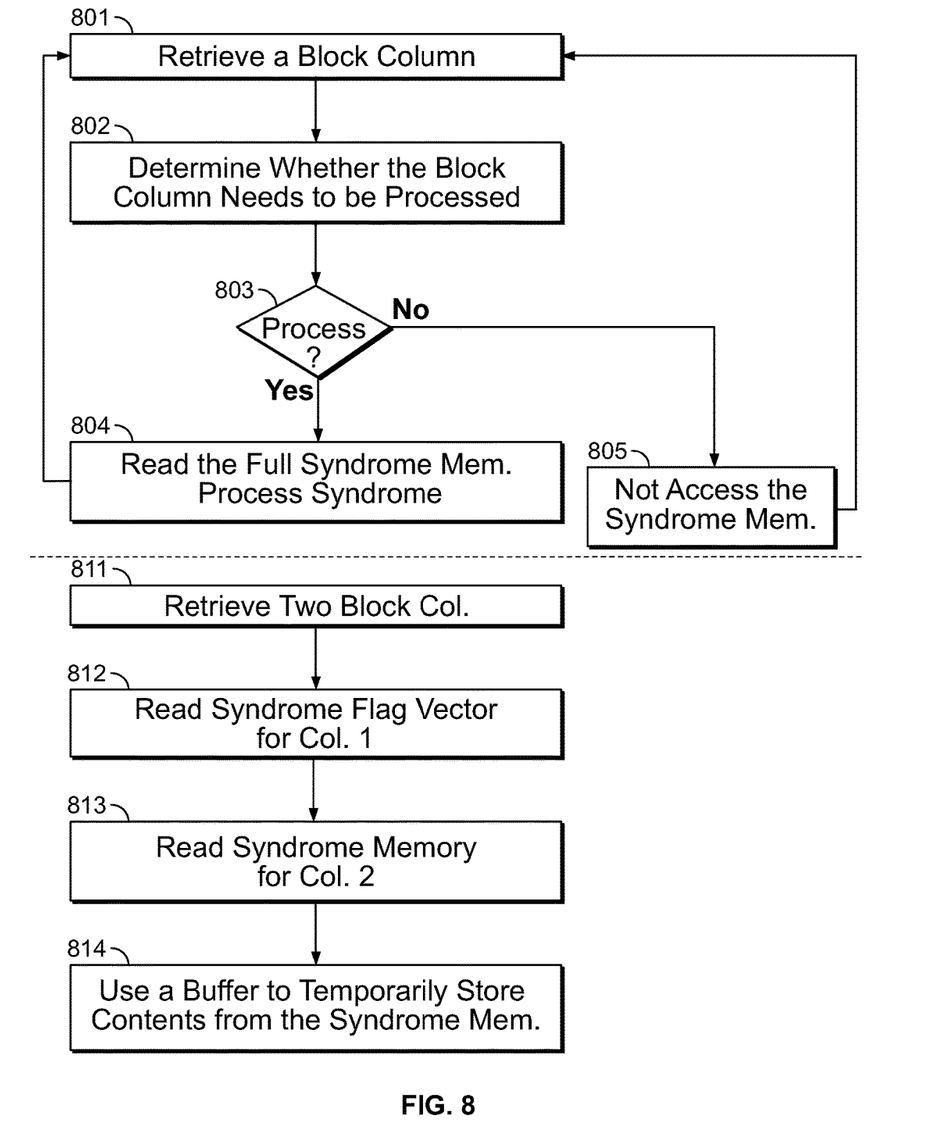
FIG. 8 provides an exemplary logic flow diagram illustrating employing a syndrome flag memory to skip reading a syndrome memory for some variable nodes.

FIG. 8 provides an exemplary logic flow diagram illustrating employing a syndrome flag memory to skip reading a syndrome memory for some variable nodes. At 801, a block column can be retrieved by the decoder and processed in two decoding cycles. In the first cycle, it can be determined whether the block column needs to be processed at 802, e.g., based on the sum of relevant entries in the syndrome flag vector. For example, the block column can be skipped if the sum of non-zero entries is greater than 5. If the block column needs to be processed at 803, it will be done so in this cycle by reading the full syndrome memory in the second decoding cycle at 804. Else, no syndrome read is performed during this cycle at 805.

Alternatively, two block columns can be processed every decoding cycle at 811. For one block column, relevant entries in the syndrome flag vector are read from the syndrome flag memory at 812. For another block column, the syndrome memory is read if needed at 813. A small buffer can hold the code memory content for the two block columns at 814, and only one entry needs to be read from the buffer every clock cycle as previously discussed, e.g., some variable nodes may not need to be read for a particular iteration. The following table illustrates an example showing that the average number of syndrome access can be reduced with the use of a special buffer.

TABLE 2

Frequency of Syndrome Access with Syndrome Flag Memory

| SNR | Avg. # Errors | Avg. # Syndrome Access | New Avg. # Syndrome Access |
| --- | --- | --- | --- |
| 15.8 | 19.5 | 1156 | 668 |
| 16.2 | 12 | 996 | 484 |
| 16.6 | 7 | 852 | 424 |
| 17 | 4 | 740 | 408 |

It is to be understood that the embodiments discussed in FIGS. 1-8 relate to BF decoders for illustration, and such embodiments are applicable to a wide range of iterative decoding schemes.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure, and various modifications can be made without departing from the scope of the present disclosure. The above-described embodiments of the present disclosure are presented for purposes of illustration and not of limitation, and the present disclosure is limited only by the claims that follow.

What is claimed is:

1. A method for iterative decoding, the method comprising:
    instantiating, via a decoding processor, an iterative decoding procedure for decoding a codeword; and
    at each iteration of the iterative decoding procedure:
        retrieving, from a syndrome memory unit, a plurality of decoding variables generated from the codeword and a respective characteristic associated with each of the plurality of decoding variables, and assigning, in reliance upon respective characteristics, a respective group number indicative of an order that the plurality of the decoding variables are to be processed at the respective iteration,
        updating at least a first subset of the plurality of decoding variables and each respective characteristic associated with each of the first subset of the plurality of decoding variables according to the order that the plurality of the decoding variables are to be processed based on the assigned respective group number; and
        storing, at the syndrome memory unit, updated respective characteristics associated with the first subset of the plurality of decoding variables for processing at least a second subset of the plurality of decoding variables at a next iteration.

2. The method of claim 1, wherein the respective characteristic associated with each of the plurality of decoding variables comprises a maximum number of satisfied checks associated with the respective decoding variable.

3. The method of claim 1, wherein the updating at least a first subset of the plurality of decoding variables and each respective characteristic associated with each of the first subset of the plurality of decoding variables to the order comprises:
    calculating, by the decoding processor, a respective maximum satisfied checks indicator relating to each decoding variable based at least in part on a comparison of a respective number of satisfied checks associated with the respective decoding variable; and
    assigning the respective group number to each respective decoding variable by ranking the plurality of decoding variables based on the respective maximum satisfied checks indicator.

4. The method of claim 3, further comprising:
    assigning the respective group number to the respective decoding variable to indicate whether the respective decoding variable is to be processed or an order when the respective decoding variable is to be processed at the current iteration.

5. The method of claim 4, further comprising:
    assigning the respective group number to the respective decoding variable to indicate a number of subsequent iterations to skip for the respective decoding variable.

6. The method of claim 4, further comprising:
    updating the respective group number for each respective decoding variable from a subset of the plurality of decoding variables at the end of the respective iteration after the first subset of the plurality of decoding variables have been updated.

7. The method of claim 1, further comprising:
retrieving a skip counter status associated with each of the plurality of decoding variables; and
determining a number of subsequent iterations for a respective decoding variable to be skipped based on the skip counter status.

8. The method of claim 1, further comprising:
dividing the plurality of decoding variables into a first group and a second group based on the characteristic associated with each decoding variable; and
processing decoding variables in the second group before decoding variables in the first group at the respective iteration.

9. The method of claim 1, further comprising:
storing, at a flag memory unit that is separate from the syndrome memory unit, a flag vector associated with the plurality of decoding variables to at least partially indicate a decoding status of the plurality of decoding variables.

10. The method of claim 1, further comprising:
retrieving, by the decoding processor, and from a syndrome memory unit, a block column by reading entries of the block column from the syndrome memory unit at the respective iteration;
caching, at a buffer that is different from the syndrome memory unit, the entries of the block column; and
reading, from the buffer, a subset of the entries of the block column for decoding without reading the entire block column at a subsequent iteration.

11. The method of claim 10, wherein the reading, from the buffer, a subset of the entries of the block column for decoding without reading the entire block column at a subsequent iteration further comprises:
at the subsequent iteration:
determining that the block column is to be skipped by reading a flag vector from a flag memory unit, and continuing decoding without reading the block column from the syndrome memory unit.

12. A system for iterative decoding, the system comprising:
a syndrome memory unit configured to store a plurality of decoding variables generated from a codeword and a respective characteristic associated with each of the plurality of decoding variables; and
a decoding processor configured to:
assign a respective group number indicative of an order that the plurality of the decoding variables are to be processed during a given iteration based on the respective characteristics;
instantiate an iterative decoding procedure for decoding a codeword; and
at each iteration of the iterative decoding procedure:
retrieve, from the syndrome memory unit, the plurality of decoding variables corresponding to at the respective iteration,
update at least a first subset of the plurality of decoding variables and each respective characteristic associated with each of the first subset of the plurality of decoding variables according to the order that the plurality of the decoding variables are to be processed based on the assigned respective group number; and
store, at the syndrome memory unit, updated respective characteristics associated with the first subset of the plurality of decoding variables for processing at least a second subset of the plurality of decoding variables at a next iteration.

13. The system of claim 12, wherein the respective characteristic associated with each of the plurality of decoding variables comprises a maximum number of satisfied checks associated with the respective decoding variable.

14. The system of claim 12, wherein the decoding processor is further configured, when updating at least the first subset of the plurality of decoding variables and each respective characteristic associated with each of the first subset of the plurality of decoding variables according to the order, to:
calculate, by the decoding processor, a respective maximum satisfied checks indicator relating to each decoding variable based at least in part on a comparison of a respective number of satisfied checks associated with the respective decoding variable; and
assign the respective group number to each respective decoding variable by ranking the plurality of decoding variables based on the respective maximum satisfied checks indicator.

15. The system of claim 14, wherein the decoding processor is further configured to:
assign the respective group number to the respective decoding variable to indicate whether the respective decoding variable is to be processed or an order when the respective decoding variable is to be processed at the current iteration.

16. The system of claim 15, wherein the decoding processor is further configured to:
assign the respective group number to the respective decoding variable to indicate a number of subsequent iterations to skip for the respective decoding variable.

17. The system of claim 15, wherein the decoding processor is further configured to:
update the respective group number for each respective decoding variable from a subset of the plurality of decoding variables at the end of the respective iteration after the first subset of the plurality of decoding variables have been updated.

18. The system of claim 12, wherein the decoding processor is further configured to:
retrieve, from the syndrome memory unit, a skip counter status associated with each of the plurality of decoding variables; and
determine a number of subsequent iterations for a respective decoding variable to be skipped based on the skip counter status.

19. The system of claim 12, wherein the decoding processor is further configured to:
divide the plurality of decoding variables into a first group and a second group based on the characteristic associated with each decoding variable; and
process decoding variables in the second group before decoding variables in the first group at the respective iteration.

20. The system of claim 12, further comprising:
a flag memory unit that is separate from the syndrome memory unit, the flag memory unit being configured to store a flag vector associated with the plurality of decoding variables to at least partially indicate a decoding status of the plurality of decoding variables.

21. The system of claim 12, wherein the decoding processor is further configured to:
retrieve, from the syndrome memory unit, a block column by reading entries of the block column from the syndrome memory unit at the respective iteration;
cache, at a buffer that is different from the syndrome memory unit, the entries of the block column; and read, from the buffer, a subset of the entries of the block column for decoding without reading the entire block column at a subsequent iteration.

22. The system of claim 21, wherein the wherein the decoding processor is further configured to:
at the subsequent iteration:
determining the block column is to be skipped by reading a flag vector from a flag memory unit, and
continuing decoding without reading the block column from the syndrome memory unit.

* * * * *